United States Patent
Kanitz et al.

(10) Patent No.: US 9,040,112 B2
(45) Date of Patent: May 26, 2015

(54) SOLUTION-PROCESSED ORGANIC ELECTRONIC STRUCTURAL ELEMENT WITH IMPROVED ELECTRODE LAYER

(75) Inventors: Andreas Kanitz, Höchstadt (DE); Ralph Pätzold, Roth (DE); Wiebke Sarfert, Herzogenaurach (DE); Riikka Suhonen, Erlangen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 13/467,594

(22) Filed: May 9, 2012

(65) Prior Publication Data

US 2012/0220075 A1 Aug. 30, 2012

Related U.S. Application Data

(63) Continuation of application No. 12/234,903, filed on Sep. 22, 2008, now abandoned.

(30) Foreign Application Priority Data

Sep. 24, 2007 (DE) .......................... 10 2007 045 518

(51) Int. Cl.
- H01L 51/00 (2006.01)
- H01L 51/52 (2006.01)
- H01L 51/50 (2006.01)
- H01L 51/44 (2006.01)

(52) U.S. Cl.
CPC ......... *H01L 51/5221* (2013.01); *H01L 51/0003* (2013.01); *H01L 51/0037* (2013.01); *H01L 51/0094* (2013.01); *H01L 51/441* (2013.01); *H01L 51/5088* (2013.01)

(58) Field of Classification Search
USPC .......................................................... 427/64
See application file for complete search history.

(56) References Cited

U.S. PATENT DOCUMENTS

| | | | |
|---|---|---|---|
| 5,965,281 A | 10/1999 | Cao | |
| 6,194,119 B1 * | 2/2001 | Wolk et al. | 430/200 |
| 2001/0033347 A1 * | 10/2001 | Kitahora et al. | 349/58 |
| 2003/0088043 A1 * | 5/2003 | Huang et al. | 528/25 |
| 2003/0209707 A1 | 11/2003 | Tsuchiya | G02F 1/13357 |
| 2003/0224203 A1 * | 12/2003 | Raychaudhuri et al. | 428/690 |
| 2005/0236973 A1 | 10/2005 | Leo et al. | 313/504 |
| 2009/0212280 A1 | 8/2009 | Werner et al. | 257/40 |

FOREIGN PATENT DOCUMENTS

| | | | | |
|---|---|---|---|---|
| DE | 10261609 | 12/2002 | ............. | H01L 51/10 |
| EP | 1365633 | 12/2001 | ............. | H05B 33/14 |
| EP | 1369937 A2 | 12/2003 | ............. | H01L 51/50 |

(Continued)

OTHER PUBLICATIONS

JP2004-335137 (machine translation), Nov. 25, 2004.*

(Continued)

*Primary Examiner* — Robert Vetere

(74) *Attorney, Agent, or Firm* — McDermott Will & Emery LLP

(57) ABSTRACT

A solution-processed organic electronic structural element has an improved electrode layer. Located between the active organic layer and the electrode layer there is either an interface or an interlayer containing a cesium salt.

11 Claims, 4 Drawing Sheets

(56) References Cited

FOREIGN PATENT DOCUMENTS

| | | | |
|---|---|---|---|
| EP | 1369938 A2 | 12/2003 | ............... H01L 51/50 |
| EP | 1648042 | 10/2004 | ............... H01L 51/40 |
| EP | 1725080 | 3/2005 | ............... H05B 33/14 |
| FR | 2892860 | 2/2006 | ............... H01L 51/54 |
| JP | 63-230795 | 9/1988 | |
| JP | 07-089928 | 4/1995 | |
| JP | 2003-303681 A | 10/2003 | |
| JP | 2004014511 A | 1/2004 | |
| JP | 2004014512 A | 1/2004 | |
| JP | 2004/335137 | 11/2004 | ............... H01L 51/50 |
| JP | 2004-335137 A | 11/2004 | ............... H01L 51/50 |
| JP | 2007059243 A | 3/2007 | |
| JP | 2007-088015 A | 4/2007 | |
| WO | 2005/086251 A2 | 9/2005 | ............... C07F 11/00 |
| WO | 2007/069539 A1 | 6/2007 | ............... C09K 11/06 |

OTHER PUBLICATIONS

JP2007-088015 (machine translation), Apr. 5, 2007.*
European Search Report and Written Opinion for Application No. 08164755.4 (7 pages), Aug. 18, 2011.
Japanese Office Action, Application No. 2008-240682, 7 pages, Feb. 1, 2013.

* cited by examiner

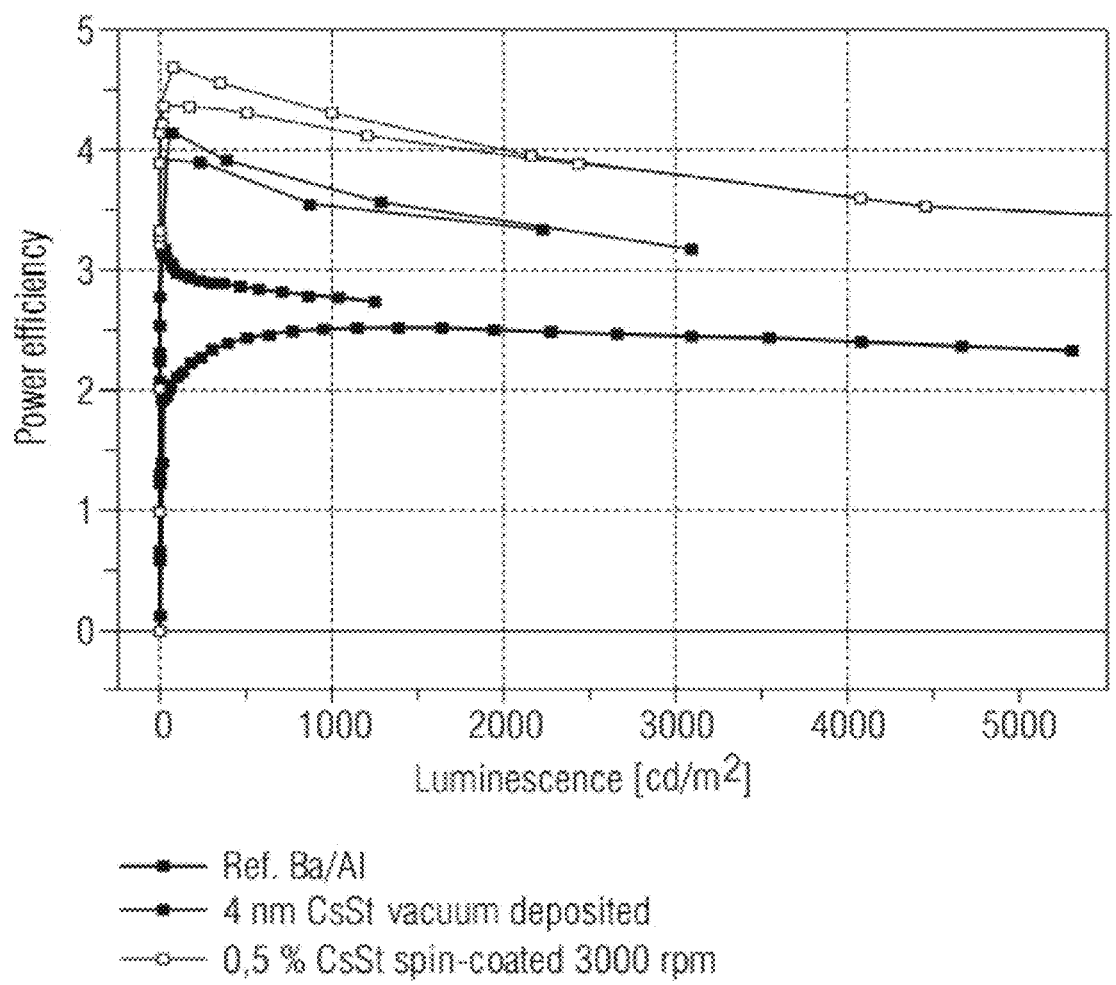

SOLUTION-PROCESSED ORGANIC ELECTRONIC STRUCTURAL ELEMENT WITH IMPROVED ELECTRODE LAYER

CROSS-REFERENCE TO RELATED APPLICATIONS

This application is a continuation of U.S. patent application Ser. No. 12/234,903 now abandoned filed on Sep. 22, 2008, which claims priority to German Patent Application No. 10 2007 045 518.8 filed on Sep. 24, 2007, the contents of which is incorporated herein by reference in its entirety.

TECHNICAL FIELD

The invention relates to a solution-processed organic electronic structural element with an improved electrode layer.

BACKGROUND

In recent years, organic electronic structural elements, such as for example organic photodetectors, organic electrochromic devices and/or organic light-emitting diodes constructed on the basis of so-called "small molecules" were in particular improved by the fact that they contained n- and/or p-doped organic semiconductor layers which simplified the injection of the respective charge carriers, i.e. for example that the OLEDs achieved the same luminescence with a lower operating voltage. This technology is known, for example, from WO 2005086251 A2.

The doping of charge-injection layers is to a large extent unknown with solution-processed organic electronic structural elements such as for example polymeric OLEDs since it is difficult to separate several organic materials obtained from solution one on top of the other without detaching or partially dissolving the underlying layer/layers again.

In order to ensure good electron injection into the polymeric layers of organic electronic components, the cathode has multiple layers, for example, particularly advantageously made of barium and aluminum. Hereby, the barium is used as the electron source due to its lower work function.

The drawback of the technology is that barium is extremely susceptible to oxidation, i.e. it is instable, and aluminum cannot be used on its own as a cathode material since its injection barrier/work function is too high.

At the same time, the use of aluminum in the multilayer electrode with barium only provides primary oxidation protection with the coating of the oxidation-susceptible barium layer.

SUMMARY

An electrode for the injection of electrons from a metallic coating into the polymeric active organic semiconductive layer of the electronic structural element can be provided which corresponds to n-doping.

According to an embodiment, a solution-processed organic electronic structural element may comprise a substrate, at least two single-layer or multilayer electrodes, between them at least one active organic semiconductive layer and between an electrode layer and an active organic semiconductive layer an intermediate layer and/or an interface, characterized in that a cesium salt of an organic mono-, oligo- and polycarboxylic or sulfonic acid is contained as an n-dopant in the intermediate layer/the interface.

According to another embodiment, the cesium salt can be at least one compound selected from the group of structure types consisting of:

monocarboxylic acids:

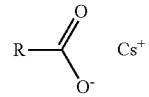

alkane sulfonic acids:

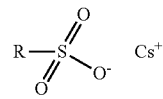

dicarboxylic acids:

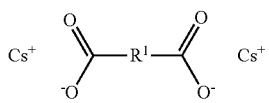

disulfonic acids:

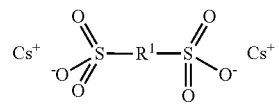

polymer-bound carboxylic acids:

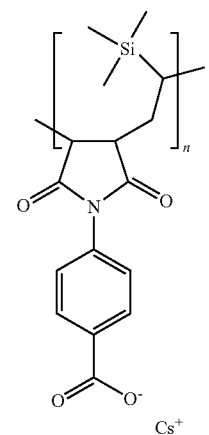

and polymer-bound sulfonic acids

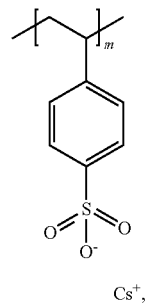

wherein R stands for alkyl ($C_1$-$C_{20}$ normal, branched, saturated or unsaturated and/or hydroxy-substituted), phenyl (alkylated and/or hydroxy- and/or alkoxy-substituted) and/or pyridyl, $R^1$ stands for alkylene ($C_2$-$C_{20}$ normal, branched, saturated or unsaturated and hydroxy-substituted), 1,2-phenylene, 1,3-phenylene 1,4-phenylene or 2,6-pyridylen, n and m stand for any commercially available degrees of polymerization of the precursor materials. According to another embodiment, the intermediate layer/the interface, which contains the cesium salt, may be applied solution-processed. According to another embodiment, the intermediate layer/the interface containing the cesium salt may be vacuum deposited. According to another embodiment, the intermediate layer/the interface containing the cesium salt may have a thickness in the range between 0.1 nm and 15 nm.

BRIEF DESCRIPTION OF THE DRAWINGS

The figures show device characteristic curves such as those that were achieved with the example described:
the structure of the component on a substrate comprised:
ITO/PEDOT:PSS (60 nm)/White Polymer (70 nm)/CsSt/Al
FIG. 4 shows a further efficiency curve

DETAILED DESCRIPTION

Figure 1:
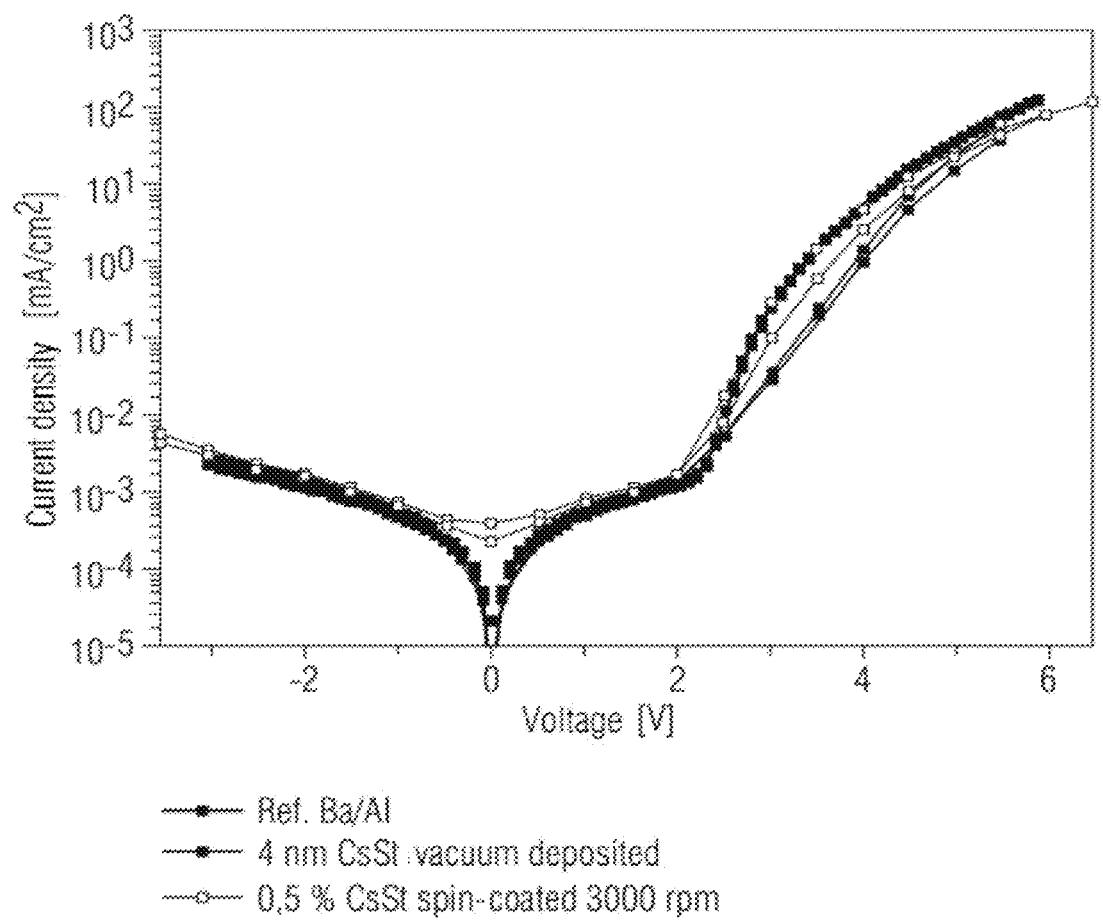
FIG. 1 shows the current-voltage curve

According to various embodiments, a solution-processed organic electronic structural element may comprise a substrate, at least two single-layer or multilayer electrodes, between them at least one active organic semiconductive layer and between an electrode layer and an active organic semiconductive layer an intermediate layer and/or an interface, characterized in that a cesium salt of an organic mono-, oligo- and polycarboxylic or sulfonic acid is contained as an n-dopant in the intermediate layer/the interface.

Denoted as an interface is the layered region of two adjacent layers which do not necessarily have to be clearly delimited, in which, according to the surface conditions of the layers in question or for other reasons, the precise material composition has changed, for example, compared to the center of the layer or to the opposing layer surface. For example, the application of voltage to both sides of a layer laced with charge carriers causes the charge carriers with a positive charge to migrate to the negative pole and the charge carriers with a negative charge to migrate to the opposite side, while on the other hand, a uniform distribution of the charge carriers will be observed in center of the layer. The interface is then denoted as the part of the layer in which an increase in one type of charge carriers is observed.

General formulas of examples of cesium salts that are simple and cheap to obtain and can be used according to an embodiment are shown below:

1) Monocarboxylic Acids:

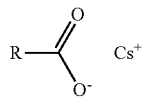

2) Alkane Sulfonic Acids:

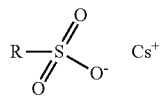

3) Dicarboxylic Acids:

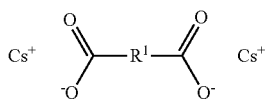

4) Disulfonic Acids:

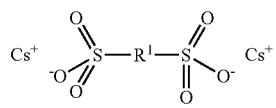

5) Polymer-Bound Carboxylic Acids:

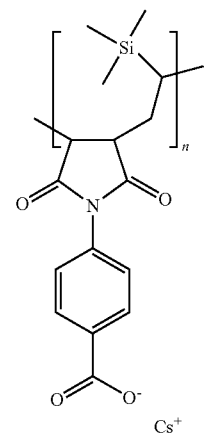

6) Polymer-Bound Sulfonic Acids

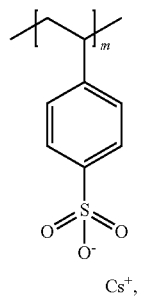

wherein R stands for alkyl ($C_1$-$C_{20}$ normal, branched, saturated or unsaturated and/or hydroxy-substituted), phenyl (alkylated and/or hydroxy- and/or alkoxy-substituted) and/or pyridyl, $R^1$ stands for alkylene ($C_2$-$C_{20}$ normal, branched, saturated or unsaturated and hydroxy-substituted), 1,2-phenylene, 1,3-phenylene 1,4-phenylene or 2,6-pyridylene, n and m stand for any natural numbers, commercially obtainable degrees of polymerization of the precursor materials, wherein precursor materials should be understood, for example to be free organic polyacids or organic polysulfonic acids.

Denoted as polymeric organic electronic components are organic electronic components comprising solution-processed long-chain organic layers.

Material properties suitable for liquid processes are achieved for example by the length of the alkyl groups. It is also possible to use different solvents.

The semiconductive organic material can for example be applied from solution, from preferably polar solvents; depending upon the cesium salt used, it can also be vacuum deposited. Application can preferably be performed using the known coating methods such as spin coating, spraying, sputtering etc.

To construct the electronic component, a lower single-layer or multilayer electrode is applied to a substrate, followed by an organic semiconductive and active layer and finally a layer, in which the use according to an embodiment of cesium salts is implemented. The electrode layer is applied to this intermediate layer for better electron injection from a metal electrode such as for example an aluminum electrode.

The materials are produced by the conversion of the free acids under heating with cesium carbonate in a polar solvent (butanol, ethanol or acetonitrile etc.)

The layer thickness of the emission layer depends upon the emitter material and is typically less than 15 nm, that is in the range of from 0.1 to 15 nm, in particular less than 10 nm and particularly preferably in the range of 3 to 5 nm.

Preferably used as electrode layers can be metal electrode layers, such as, for example, layers made of aluminum, silver, gold, palladium, chromium, zinc, platinum etc and any alloys thereof.

The invention is described in more detail below with reference to exemplary embodiments:

a) Representation of Cesium Stearate:

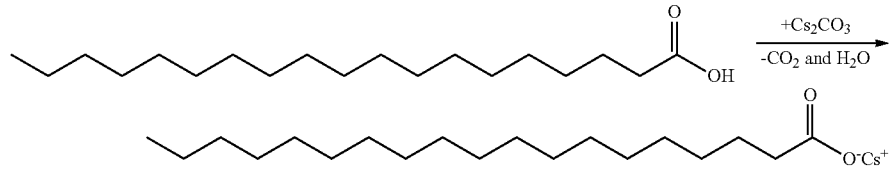

A mixture of $Cs_2CO_3$ and stearic acid was added to butanol in the ratio 1:2 and kept at reflux temperature until no more CO2 formed. Subsequently, butanol was separated on the rotary evaporator, the residue mixed with ether and aspirated, m.p.:263-269° C.

b) Representation of Dicesium Sebacinate:

A mixture of $Cs_2CO_3$ and sebacic acid was added to butanol in the ratio 1:1 and kept at reflux temperature until no more CO2 formed. Subsequently, butanol was separated on the rotary evaporator, the residue mixed with ether and aspirated.

c) Representation of the Cesium Salt of Polystyrene Sulfonic Acid:

A mixture of $Cs_2CO_3$ and polystyrene sulfonic acid 20%-aqueous solution was added in the ratio 1:2 and briefly heated until no more CO2 formed. Subsequently, butanol was added and the water and the butanol separated on the rotary evaporator, the residue was mixed with ether and aspirated.

d) Representation of the Cesium Salt of a Carboxylic Acid-Functionalized Polyimide:

d1) Synthesis of the Copolymers d1a) Radical Polymerization

Under absolutely anhydrous conditions and under oxygen-free inert gas rinsing, 0.5 mol maleic anhydride and 0.5 mol trimethylallyl silane were dissolved in 500 ml dioxane and with the addition of 2 mol % AIBN (azo-iso butyric acid nitrile) as a radical starter brought to reaction under agitation and thermostatting to 50° C. for 10 h. Subsequently, the solvent was completely removed in a vacuum on a rotary evaporator. Tg: 200° C.; yield quantitative.

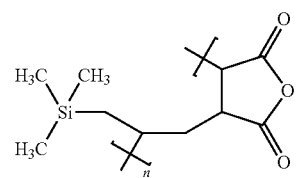

D1b) Imidizing Condensation 21.4 g of the copolymer obtained according to example d1a were dissolved under agitation in 40 ml dimethylformamide and heated at 50° C. for 2 h. It was subsequently precipitated in ethanol. The precipitated product was dried at 150° C. in a drying cabinet and dehydrated.

Figure 2:
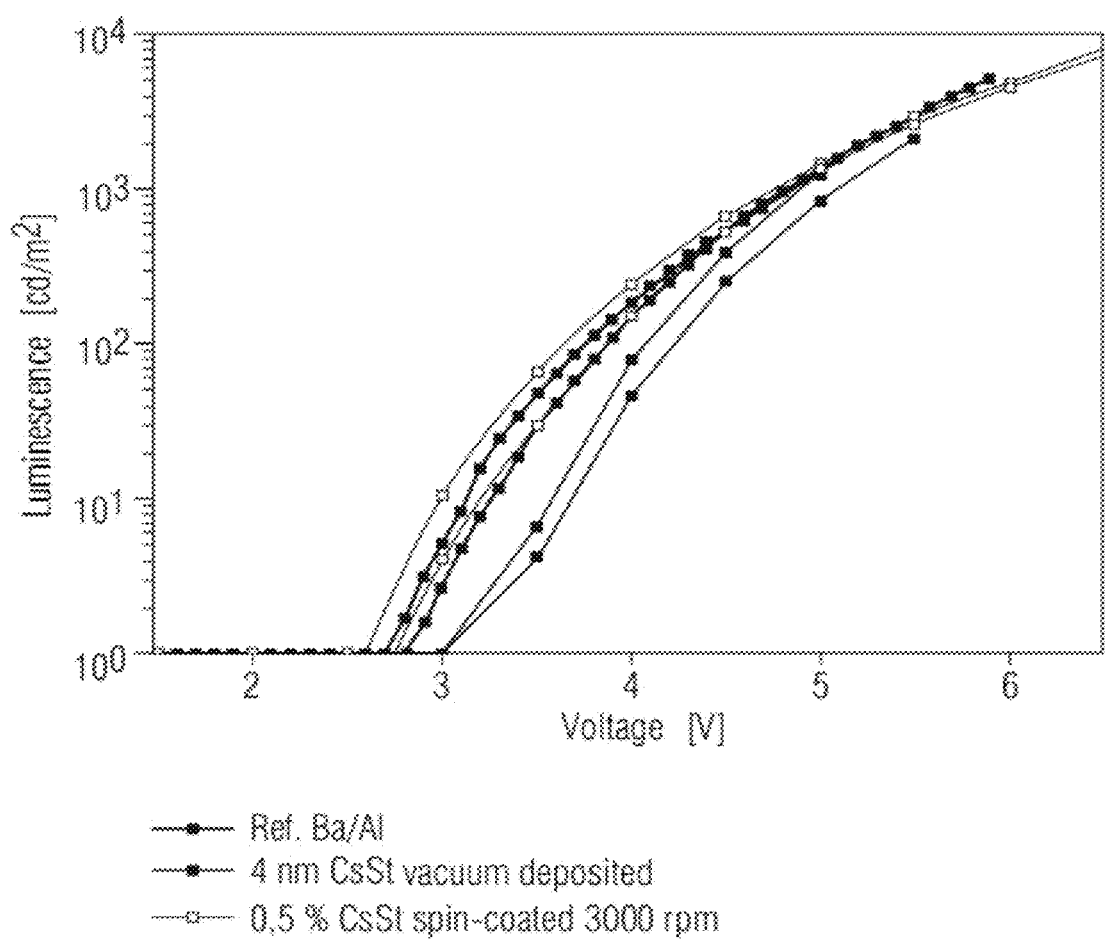
FIG. 2 shows the luminescence curve

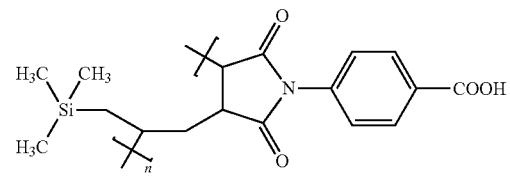

d2) Synthesis of the Cesium Salt:

A mixture of $Cs_2CO_3$ and poly[trimethylsilylallyl-co-N-(4-carboxyphenyl)-maleic acid imide was added in the ratio 1:2 to acetonitrile and heated at reflux temperature until no more CO2 formed. Subsequently, the acetonitrile was separated on the rotary evaporator, the residue was mixed with ether and aspirated.

e) Construction and Application of the Layers of a Polymeric Oled (Comparison with Prior Art, Cesium Stearate Separated by Vapor Deposition, Cesium Stearate Separated by Spin Coating):

Example of a Production Process for the Electronic Component:

- spin coating PEDOT:PSS 60-80 nm on ITO substrate (glass)
- annealing the PEDOT layer
- spin coating an LEP (light-emitting polymer) 70-100 nm spin coating the organic cesium salt layer or vapor deposition of the organic-cesium salt layer or vapor deposition of the barium layer vapor deposition of the aluminum layer As can be identified in FIGS. 1 and 2, the component is not in any way inferior compared to the reference with a barium-aluminum electrode, but displays virtually identical current-voltage and luminescence values.

Figure 3:
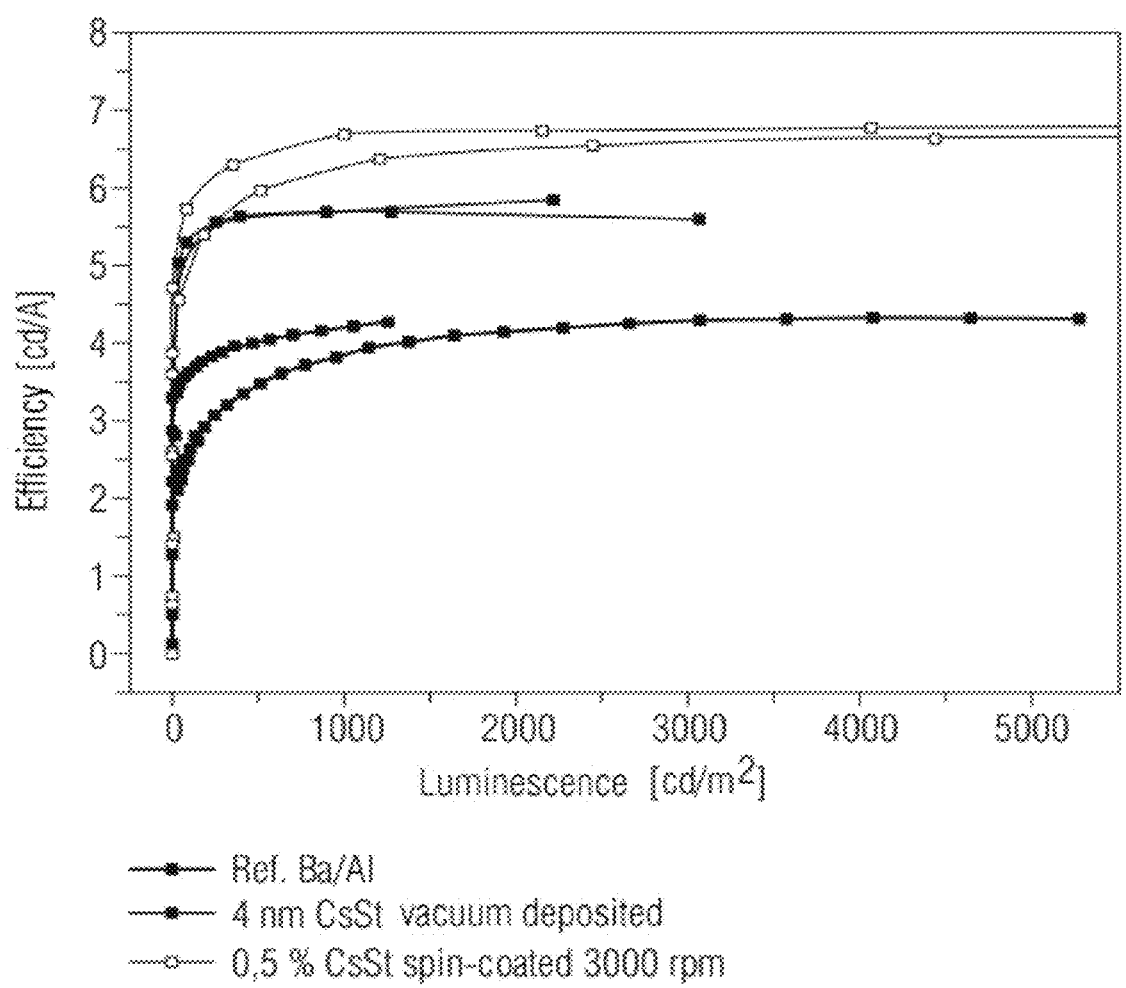
FIG. 3 shows the efficiency curves

It may be identified from FIGS. 3 and 4 that the method of applying the cesium layer can still have a significant influence on the efficiency of the component.

The various embodiments provide for the first time an alternative to a multilayer electrode using barium in organic electronic components. Hereby, an intermediate layer comprising at least one cesium salt is integrated which makes it possible for the operating voltage and luminescence of the organic component, that is for example of the OLED compared to the OLED with barium as an electron injection layer, to have at least an equivalent efficiency (see Figs. with the characteristic curves).

The various embodiments describe the use of an alkali metal salt as an n-dopand for doping an organic semiconductive material in order to change the electrical properties of the latter, wherein the alkali metal salt represents an n-dopand with respect to the adjacent materials.

The various embodiments relate to a solution-processed organic electronic structural element with an improved electrode layer. Located between the active organic layer and the electrode layer there is either an interface or an interlayer, that is an intermediate layer containing a cesium salt.

What is claimed is:

1. A method of producing a solution-processed organic electronic structural element comprising a substrate, at least two single-layer or multilayer electrodes, between them at least one active organic semiconductive layer, comprising: depositing an n-dopant of a cesium salt in the form of a solution, thereby producing an intermediate layer or an interface between an electrode layer and an active organic semiconductive layer, wherein the intermediate layer or the interface has a thickness of less than 15 nm, wherein the cesium salt is at least one compound selected from the group of structure types consisting of:

alkane sulfonic acids:

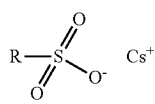

disulfonic acids:

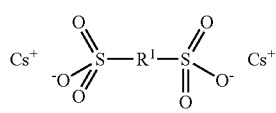

polymer-bound carboxylic acids:

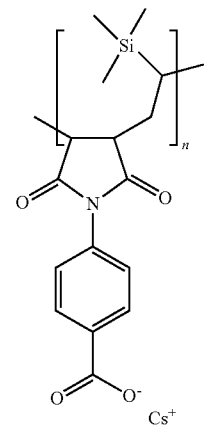

and polymer-bound sulfonic acids

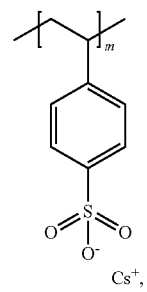

wherein R stands for alkyl ($C_1$-$C_{20}$ branched, or unsaturated and/or hydroxy-substituted), phenyl (alkylated and/or hydroxy- and/or alkoxy-substituted) and/or pyridyl, wherein $R^1$ stands for alkylene ($C_2$-$C_{20}$ normal, branched, saturated or unsaturated and hydroxy-substituted), 1,2-phenylene, 1,3-phenylene 1,4-phenylene or 2,6-pyridylen, and wherein n and m stand for any natural numbers.

2. The method of producing a structural element according to claim 1, wherein the intermediate layer/the interface containing the cesium salt has a thickness in the range between 0.1 nm and 15 nm.

3. The method of producing a structural element according to claim 1, wherein the intermediate layer/the interface containing the cesium salt has a thickness in the range between 3 nm and 5 nm.

4. The method of producing a structural element according to claim 1, wherein the intermediate layer/the interface has a thickness of less than 10 nm.

5. The method of producing a structural element according to claim 1, wherein the n-dopant of cesium salt is deposited in a spin coating process.

6. The method of producing a structural element according to claim 1, further comprising, prior to depositing the n-dopant of cesium salt:
spin coating a layer of PEDOT:PSS (poly(3,4-ethylenedioxythiophene) poly(styrenesulfonate)) on a substrate;
annealing the PEDOT:PSS layer; and
spin coating an LEP layer (light-emitting polymer) on the annealed PEDOT:PSS layer;
wherein the n-dopant of cesium salt is deposited on the LEP layer.

7. A method of producing a solution-processed organic electronic structural element comprising a substrate, at least two single-layer or multilayer electrodes, between them at least one active organic semiconductive layer, comprising:
depositing an n-dopant of a cesium salt in the form of a solution, thereby producing an intermediate layer and an interface between an electrode layer and an active organic semiconductive layer, wherein the intermediate layer and interface has a thickness of less than 15 nm, wherein the cesium salt is at least one compound selected from the group of structure types consisting of:
alkane sulfonic acids:

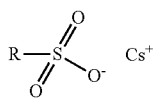

disulfonic acids:

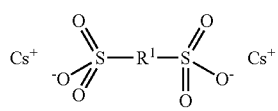

polymer-bound carboxylic acids:

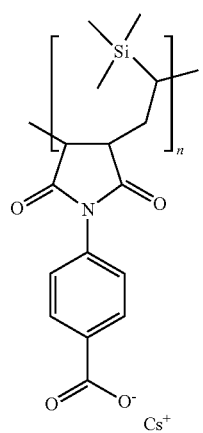

and polymer-bound sulfonic acids

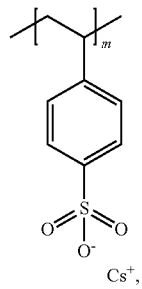

wherein R stands for alkyl ($C_1$-$C_{20}$ branched, or unsaturated and/or hydroxy-substituted), phenyl (alkylated and/or hydroxy- and/or alkoxy-substituted) and/or pyridyl, wherein $R^1$ stands for alkylene ($C_2$-$C_{20}$ normal, branched, saturated or unsaturated and hydroxy-substituted), 1,2-phenylene, 1,3-phenylene 1,4-phenylene or 2,6-pyridylen, and wherein n and m stand for any natural numbers.

8. The method of producing a structural element according to claim 7, wherein the intermediate layer and interface containing the cesium salt has a thickness in the range between 0.1 nm and 15 nm.

9. The method of producing a structural element according to claim 7, wherein the intermediate layer/the interface containing the cesium salt has a thickness in the range between 3 nm and 5 nm.

10. The method of producing a structural element according to claim 9, wherein the intermediate layer/the interface has a thickness of less than 10 nm.

11. The method of producing a structural element according to claim 7, wherein the n-dopant of cesium salt is deposited in a spin coating process.

* * * * *